US006723143B2

(12) United States Patent
Towery et al.

(10) Patent No.: US 6,723,143 B2
(45) Date of Patent: Apr. 20, 2004

(54) REACTIVE AQUEOUS METAL OXIDE SOLS AS POLISHING SLURRIES FOR LOW DIELECTRIC CONSTANT MATERIALS

(75) Inventors: Daniel Towery, Santa Clara, CA (US); Michael Fury, San Francisco, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/214,677

(22) Filed: Aug. 7, 2002

(65) Prior Publication Data

US 2003/0005647 A1 Jan. 9, 2003

Related U.S. Application Data

(60) Division of application No. 09/561,387, filed on Apr. 27, 2000, now Pat. No. 6,464,740, which is a continuation-in-part of application No. 09/096,722, filed on Jun. 11, 1998, now abandoned.

(51) Int. Cl.$^7$ .............................. C09K 3/14; C09G 1/02; B24B 1/00; B24D 3/00
(52) U.S. Cl. .............................. 51/307; 51/308; 51/309; 51/293; 106/3; 451/526
(58) Field of Search .......................... 51/307, 308, 309, 51/293, 175, 397; 106/3; 438/692, 693, 691; 216/89; 451/526

(56) References Cited

U.S. PATENT DOCUMENTS

| | | | | |
|---|---|---|---|---|
| 3,429,080 A | * | 2/1969 | Lachapelle | 51/309 |
| 3,715,842 A | * | 2/1973 | Tredinnick et al. | 451/36 |
| 3,922,393 A | * | 11/1975 | Sears, Jr. | 427/215 |
| 4,057,939 A | * | 11/1977 | Basi | 451/36 |
| 4,475,981 A | * | 10/1984 | Rea | 216/89 |
| 5,352,277 A | * | 10/1994 | Sasaki | 106/6 |
| 5,643,497 A | * | 7/1997 | Kaga et al. | 516/90 |
| 5,783,489 A | * | 7/1998 | Kaufman et al. | 438/692 |
| 6,093,649 A | * | 7/2000 | Roberts et al. | 438/691 |
| 6,153,525 A | * | 11/2000 | Hendricks et al. | 438/692 |

* cited by examiner

*Primary Examiner*—Michael Marcheschi
(74) *Attorney, Agent, or Firm*—Sandra P. Thompson; Bingham McCutchen LLP

(57) ABSTRACT

An aqueous metal oxide sol slurry has been developed for removal of low dielectric constant materials. The slurry is formed directly in solution utilizing non-dehydrated chemically active metal oxide sols which are formed in a colloidal suspension or dispersion. The oxide sols have not undergone any subsequent drying and the particles are believed to be substantially spherical in structure, dimensionally stable and do not change shape over time. The sol particles are mechanically soft and heavily hydrated which reduces surface damage even in the case where soft polymer or porous dielectric films are polished. The sol particles are formed of a chemically active metal oxide material, or combinations thereof, or can be coated on chemically inactive oxide material such as silicon dioxide or can be coformed therewith. The oxide sols can include a bi-modal particle distribution. The slurry can be utilized in CMP processes, with or without conditioning.

58 Claims, 14 Drawing Sheets

REACTIVE AQUEOUS METAL OXIDE SOLS AS POLISHING SLURRIES FOR LOW DIELECTRIC CONSTANT MATERIALS

RELATED APPLICATIONS

This application is a divisional of application Ser. No. 09/561,387, filed Apr. 27, 2000, now U.S. Pat. No. 6,464,740, which has been filed pursuant to 37 C.F.R. §1.53(b) as a continuation-in-part of U.S. application Ser. No. 09/096,722, filed Jun. 11, 1998, now abandoned and claims priority therefrom as to subject matter commonly disclosed pursuant to 35 U.S.C §120 and 37 C.F.R §1.78.

BACKGROUND

1. Field of the Invention

The present invention relates to slurries and systems utilized for chemical mechanical polishing and more particularly to chemically reactive aqueous metal oxide sol slurries and polishing systems for polishing and planarizing low dielectric constant materials, which are typically ineffectively planarized by conventional abrasive slurries.

2. Description of Related Art

Integrated circuits are typically fabricated upon a silicon wafer or substrate. For definiteness, we refer hereinafter to this substrate as a "silicon wafer" or "wafer" not intending thereby to limit the scope of the present invention. During fabrication, the surface of a silicon wafer is typically subdivided into a plurality of areas (typically rectangular) onto which are formed photolithographic images, generally identical circuit patterns from area to area. Through a series of well-known processing steps, each of the rectangular areas eventually becomes an individual die on the wafer.

Generally the integrated circuit die, especially in very large scale integrated semiconductor circuits, are manufactured by depositing and patterning a conductive layer or layers upon the semiconductor wafer and then a nonconductive layer formed from an insulator, covering the conductive layer. Present technology typically makes use of a silicon dioxide ($SiO_2$) insulator, although other materials are becoming increasingly common. The layers are formed in a layered, laminar configuration, stacked upon one another creating, in general, a nonplanar topography. The nonplanarity is typically caused by the nonconductive or dielectric layers being formed over raised conductive lines or other features in the underlying layer, causing topographic structure in the overlying layers. Planarization is needed for accurate deposition and patterning of subsequent layers.

As the integrated circuit devices have become more sophisticated and hence more complex, the number of layers stacked upon one another has increased. As the number of layers increase, the planarity problems generally increase as well. Planarizing the layers during the processing of the integrated circuits thus can become a major problem and a major expense in producing the circuits. The planarity requirements have resulted in a number of approaches, and most recently, chemical mechanical polishing (or "planarization"—CMP) techniques have been utilized to planarize the semiconductor wafers. CMP has been successfully included in the manufacturing process for integrated circuits since the CMP techniques are typically less complex compared to the previously utilized polishing methods. The CMP techniques typically utilize a polishing block or pad or plurality of blocks or pads in conjunction with a chemical slurry. The polishing pad (or pads) are rubbed against the layer to be planarized with the addition of a chemical slurry to aid in obtaining the planarity of the semiconductor wafer. Wafer planarity is important for accurate deposition and patterning of the wafer during further processing steps.

The necessary parameters for polishing the $SiO_2$ based intermetal dielectric layers are well known in the semiconductor industry. The chemical and mechanical nature of polishing and wear of the $SiO_2$ based dielectrics have been reasonably well developed. One problem with the $SiO_2$ dielectrics, however, is that the dielectric constant is relatively high, being approximately 3.9. Lower dielectric constant insulators would reduce capacitive coupling and increase processing speed. Thus, it would be highly desirable to incorporate a low dielectric constant material into semiconductor structures while still being able to utilize the conventional CMP systems for polishing the surface of the resulting dielectric material during the semiconductor wafer processing.

As the geometry of the integrated circuits continues to shrink, the intrinsic circuit delays will increase due to greater resistance in the metal interconnects and from capacitance effects from the circuit interconnects. Strategies being developed to reduce the parasitic capacitance effects include incorporating metals with lower resistivity values, such as copper, and providing electrical isolation with insulating materials having low dielectric constants relative to the $SiO_2$ dielectrics.

As described herein, "low dielectric constant materials" include organic polymer materials, porous dielectric materials, whether organic or inorganic, and mixed organic and inorganic materials, whether porous or not. Typically these are polymer dielectric materials which possess desirable chemical and electrical characteristics, and may include a relatively high concentration of organic materials. These low dielectric constant materials may also include relatively highly porous inorganic materials, or materials exhibiting a combination of porosity and/or organic characteristics. The low dielectric constant films can be deposited utilizing a variety of techniques including chemical vapor deposition (CVD), physical vapor deposition (PVD) and spin coating. The polymer materials generally are mechanically soft and they readily exhibit plastic deformation and hence they easily can be scratched. However, in contrast to their mechanical sensitivity, polymers are often chemically inert, being relatively unreactive towards the reagents used in conventional aqueous-based CMP. The combination of characteristics of the polymer dielectric materials makes an aqueous based polymer CMP process difficult in that mechanical abrasion is less effective at removing such materials. Incorporating these low dielectric constant materials into viable submicron fabrication techniques for integrated circuits will necessitate the development of robust CMP processes which applicants have discovered are not currently available utilizing the $SiO_2$-based CMP processes or elsewhere.

Conventional polishing abrasives, such as $SiO_2$ and $Al_2O_3$, utilized for CMP and related polishing applications in the optical and disk industries are typically produced by chemical precipitation methods or by flame hydrolysis. In chemical precipitation, individual oxysalt particles are typically precipitated from aqueous solutions. The relatively coarse oxysalt particles are filtered, dried, and subsequently subjected to a thermal process called calcination which forms the final, finely divided oxide powder. Low calcination temperatures typically produce high surface area oxide powders that consist of very small particles. Increasing the calcination temperature typically reduces the surface area of the powder with a corresponding increase in particle size.

The resulting oxide powder is formed of very small individual primary particles that are largely dehydrated and mechanically robust. However, upon calcination, the primary particles invariably consolidate to form larger aggregate particles and agglomerated aggregate particles.

In flame hydrolysis, chlorinated or silane precursor materials are subjected to a high temperature, oxyhydrogen flame. Upon entering the flame the precursor reacts with the hydrogen and oxygen, and is transformed into the final oxide product. The particle size, particle size distribution, and surface area of the resulting oxide powder can be controlled by varying the process temperature, the residence time in the reaction chamber, and the relative concentration of the chemical precursors. Oxide powders thus formed consist of very small, dehydrated primary particles that are strongly adhered to other primary particles in a 3-dimensional network referred to as an aggregate. These aggregates are mechanically robust and are considered irreducible, i.e., they cannot be broken down to the dimensional scale of the primary particles under normal use conditions. The aggregates themselves are often entangled with other aggregates forming agglomerates.

Conventional polishing slurries are typically derived by incorporating the agglomerated oxide powder into an aqueous suspension with mechanical agitation. Limited suspension stability is obtained by incorporating dispersing agents, or adjusting the suspension pH such that a sufficiently high zeta potential is realized to impart stability through Coulombic interactions. Subsequent particle size reduction processes improve suspension stability and polishing performance by breaking down large particle agglomerates. However, these processes are incapable of completely reducing and segregating the aggregates and agglomerates back into the form of the original primary particles. Thus once formed by calcining, a significant percentage of particle aggregates and agglomerates are present in the slurry, regardless of subsequent processing.

CMP slurries tailored for $SiO_2$ dielectrics, typically incorporate $SiO_2$ abrasives in a high pH aqueous slurry. Current thinking holds that the water hydrolyzes the silicon dioxide material at the silicon dioxide/slurry interface, softening it, thus allowing the silicon dioxide particles in the slurry to abrade the surface of the dielectric. The high pH environment serves two functions: one, to impart stability to the silicon dioxide abrasive slurry and two, to increase the solubility of the hydrolyzed silicon dioxide groups in the aqueous solution. Applicants have discovered, however, that as the organic content of the film increases (as it may in constructing low dielectric constant films), the efficiency of the silicon dioxide based conventional slurries diminishes rapidly. For example, a conventional oxide slurry utilized on a typical CMP device, utilizing typical process settings, provides a removal rate of about two thousand five hundred (2500) Ångstroms per minute from the surface of the thermal oxide film. However, these same CMP conditions may only provide a removal rate of about two hundred (200) Ångstroms per minute on a purely organic polymer film. The conversion from mechanical energy to material removal is thus much lower and unacceptable for use in semiconductor processing.

SUMMARY OF THE INVENTION

The present invention relates to an aqueous metal oxide sol slurry for polishing and planarization of low dielectric constant materials. The slurry is formed directly in solution utilizing non-dehydrated, metal oxide sols which are formed in a colloidal suspension or dispersion and are chemically reactive towards the low dielectric material. The metal oxide sols are not subjected to drying subsequent to formation. The particles remain in solution or as a gel and are believed to be substantially spherical in structure. The spherical sol particles are dimensionally stable and do not typically change shape over time in response to polishing or aging. The sol particles are mechanically soft and heavily hydrated which reduces surface damage when soft polymer or porous dielectric films are being polished. The sol particles can be formed of a chemically active metal oxide material, such as $CeO_2$ or $ZrO_2$ by themselves or mixtures thereof, or can be coated on chemically inactive metal oxide material such as silicon dioxide or can be co-formed therewith (that is, as a mixture of reactive and non-reactive compounds as depicted in FIG. 5C hereof). A preferred sol slurry is multi-modal in particle size distribution. Although developed for utilization in CMP semiconductor processing the slurry sols of the present invention also can be utilized for other high precision polishing processes.

DETAILED DESCRIPTION OF THE PREFERRED EMBODIMENTS

Figure 1:
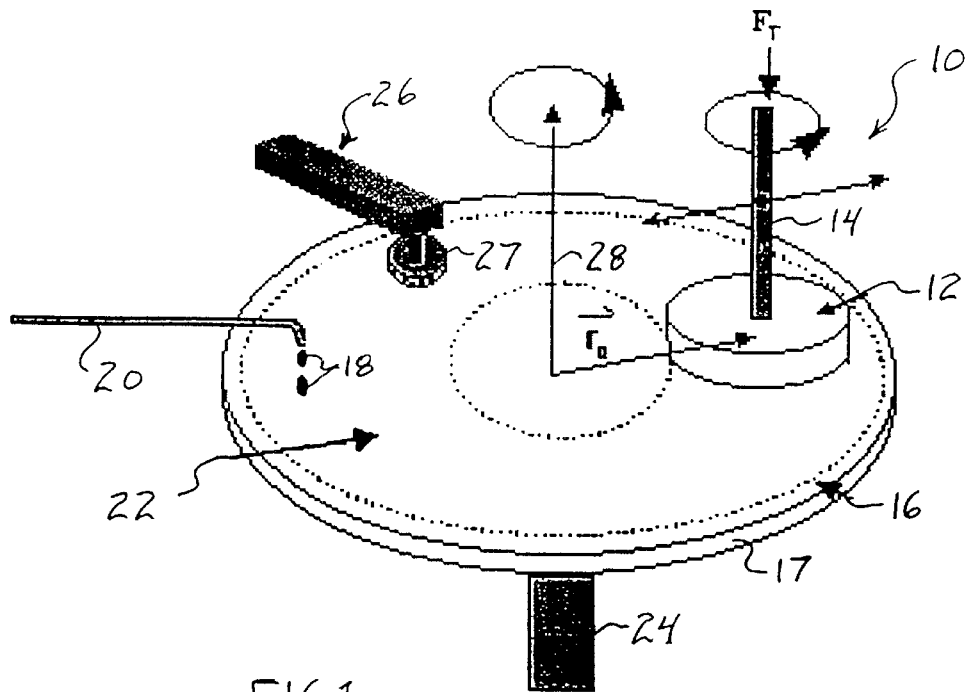
FIG. 1 depicts schematically and not to scale a perspective view of a rotary type CMP device in which the aqueous metal oxide sol slurry of the present invention can be utilized.

To facilitate description of the slurry and the method and apparatus for utilizing the slurry of the present invention, an idealized CMP system or device will be described and is designated generally by the numeral 10 in FIG. 1. The CMP device 10 is a rotary polishing device. However, the slurry of the present invention also can be utilized with any type CMP device which provides relative motion between the dielectric material to be polished and a polishing surface, such as orbital or linear CMP devices. The device 10 is described merely to aid in the understanding of a primary use of the present invention.

The CMP device 10 is of the type of polishing tool which has a mechanical design based upon the semiconductor wafer polishing tools. During CMP of a layer on a semiconductor wafer, the semiconductor wafer (not illustrated) is mounted by well known techniques in a rotary and radially oscillating semiconductor wafer carrier 12. The carrier 12 is mounted to a shaft 14 which imparts the required motion and forces on the carrier 12 in a conventional manner. The surface of the semiconductor wafer is pressed against a rotating polishing pad or block 16 or array of pads or blocks by a force $F_T$. A slurry 18, typically including abrasive particles in a controlled pH solution is added to the polishing pad 16 via a supply line or conduit 20. The polishing pad is typically made of a compliant material, striving to achieve a balance between firm abrasive action (but prone to scratching) and a compliant material, gentle to the surface being polished but possibly ineffective a removing material in commercial useful periods of time.

The slurry 18 is added to a wafer track 22, which is typically an annular ring or zone formed by the rotating polishing pad 16 and the rotating and oscillating carrier 12. The polishing pad 16 is also mounted on a shaft 24, which imports the required rotational movement onto the polishing pad 16. The shaft 24 typically is axially fixed, but could also provide a portion or all of the force $F_T$, if so desired.

Figure 2:
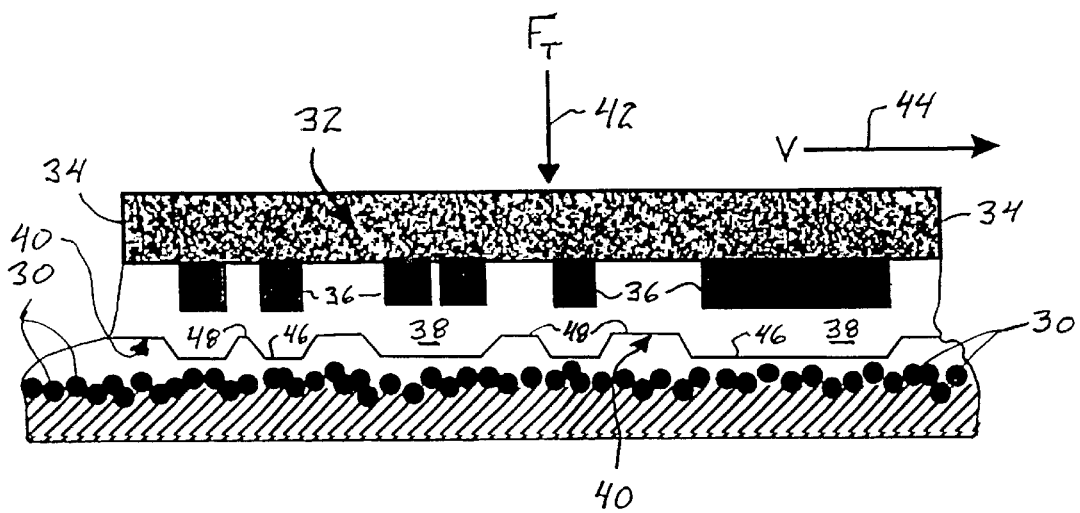
FIG. 2 depicts schematically and not to scale a magnified cross sectional view of a semiconductor wafer during a CMP process.

The slurry 18 typically but not exclusively provides both a chemical and a mechanical action on the surface of the semiconductor wafer to provide controlled removal of material and planarization of the semiconductor wafer surface, as will be described more fully with respect to FIG. 2. The semiconductor wafer typically is held by a retaining ring or other retaining mechanism in the gimbaled rotating carrier 12. The polishing pad 16 typically is formed from polyurethane or from polyurethane impregnated fiber, attached by adhesive tape (for example) in a conventional manner, to a rigid, base or plate 17 that may be temperature-controlled. It is believed that during the CMP process, the semiconductor wafer is supported by hydrodynamic forces and by direct support from the abrasive particles in the slurry 18 resting in recesses or deformities in the pad 16 at the pad-semiconductor wafer interface.

The conventional CMP process typically includes an additional process step referred to as pad conditioning. Pad conditioning is typically performed with a pad conditioner device 26, which typically includes a diamond-impregnated ring or disk tool 27. During the CMP process ("in-situ" conditioning) or just following the polishing process ("ex-situ" conditioning), the conditioner ring or tool 27 is pressed against the surface of the polishing pad 16. The pressure applied and the relative motion (generally radial and/or oscillatory relative motion) erodes a small portion of material from the surface of the polishing pad 16. This pad erosion is typically required to maintain the pad surface free of material build-up associated with the CMP products, such as spent abrasives and dielectric material removed from the surface.

The pad conditioning procedure is performed in order to maintain the micro-texture of the polishing pad 16, which tends to smooth out due to viscoelastic flow caused by the CMP process. Without pad conditioning, the removal rate and uniformity of removal of the semiconductor wafer dielectric material is typically not constant from wafer to wafer during sequential wafer processing, hence preventing reliable commercial production of the semiconductor wafer.

The size of the conditioner ring or tool 27 depends upon the size and the type of the CMP device 10, but the disk type conditioner 27 usually has a smaller diameter than that of the semiconductor wafer. A ring type conditioner (not illustrated) generally is larger than the diameter of the semiconductor wafer. Therefore, in practice, the ring type conditioner is positioned at a fixed radial distance from the central axis 28 of the polishing pad 16. The ring type conditioner rotates and provides erosion across the width of the semiconductor wafer track 22.

In the form of a disk type conditioner 27, the disk typically is smaller than the semiconductor wafer and hence is oscillated across the semiconductor wafer track 22 to provide the necessary abrasion. During the pad conditioning, the location and rotation rate of the conditioner 27 affects the uniformity of erosion in the semiconductor wafer track 22, which influences the removal rate stability and the polishing uniformity of the semiconductor wafer surface.

The CMP process continues for a predetermined time to obtain the desired amount of semiconductor wafer material removal. The predetermined time calculation is based upon the rate of removal of the semiconductor wafer dielectric material and the required amount of dielectric material to be removed. The removal amount is chosen such that at the end of the CMP process, the semiconductor wafer surface has achieved the desired planarity and the desired material thickness.

Typically, the CMP process can utilize a pressure of about $48 \times 10^3$ Pa (7.0 psi), a velocity of about 0.54 meters per second and a process time of about three (3) minutes. Referring to FIG. 1 and FIG. 2, the slurry 18 is illustrated on the polishing pad 16 and includes a plurality of abrasive particles 30. The carrier 14 is not depicted in FIG. 2. However, a portion of a semiconductor wafer 32 which is mounted in the carrier 14 is illustrated.

The semiconductor wafer 32 typically includes a silicon base layer 34, upon which are formed a plurality of deposited conductive patterned metal features 36. The metal features 36 then are covered by a deposited dielectric material layer 38. The layer 38 has a surface 40, which is not planar since it mirrors the metal features 36 underlying the layer 38. The surface 40 then must be planarized before the next photolithography step can be performed. The polishing pad 16 and the slurry 18 provide a higher localized pressure against the regions of higher topography on the surface 40 that tends to preferentially remove these features and planarize the surface 40.

The pad 16 has a predetermined hardness and is applied to the wafer with a force $F_T$ (shown by an arrow 42) undergoes relative motion with respect to the wafer at a velocity V, shown by arrow 44. During the CMP process surface regions of high topography on the surface 40, such as regions or areas 46 are subjected to higher localized contact and hence polishing pressures, than regions of low or reduced topography, such as a region or area 48. The CMP process is designed to selectively remove the regions or areas 46, while minimizing the removal of the regions 48. In theory, a perfect CMP process, assuming the surface of the region 48 is planar and of the right depth, would remove all of the regions 46 to be parallel to the surface of the regions 48. This selectivity of the CMP process is a measure of the planarization efficiency of the process.

During the CMP process, the dielectric material 38 is removed by the combined action of chemical and mechanical processes. The chemical energy is supplied by the slurry's liquid media and additionally in some cases by the abrasive particles 30 themselves. CMP slurries which are tailored for removal of dielectric materials typically are aqueous and generally have a controlled pH. The mechanical energy is generated by the relative motion and pressure between the dielectric 38 and the surface of the pad 16 with the abrasive slurry 18 entrained therebetween, as illustrated in FIG. 2.

This relative motion generates mechanical energy, W, in accordance with the principle of mechanical work;

$$W = \int F_T \mu_s ds$$

In the equation, $F_T$ is the force normal to the surface 40, $\mu_s$ is the coefficient of sliding friction between the wafer surface 40 and the pad 16 and ds is a differential element of length.

By transferring the differential element of length to a differential element of time, the following equation is obtained $$W = \int F_T \mu_s dt$$

In this equation, v is the relative velocity between the pad 16 and the dielectric 38. Integration of this equation yields the total work generated during the specified time domain. Thus, increasing any of the variables $F_T$, $\mu_s$, v or the polishing time t increases the material removed during the CMP polishing process. As is well known, F. W. Preston recognized the relationship between work and the amount of material removal and formalized the relationship in an equation, now known as the Preston equation, which can be stated in differential form as:

$$\frac{dh}{dt} = K_p P \frac{ds}{dt}$$

In the Preston equation, $K_p$ is the Preston coefficient, P is the polishing pressure acting normal to the surface of the wafer 40 and ds/dt is the instantaneous relative velocity between the pad 16 and the surface 40.

As previously mentioned, the CMP process parameters for the conventional $SiO_2$-based dielectric layer 38 are well known. To achieve the desired decrease in the dielectric constant from the 3.9 constant of the $SiO_2$ material, requires use of a different material having a lower dielectric constant. The development of these dielectric materials has focused on polymer based materials, such as the following:

1. Poly(arylene) Ether
2. Poly(naphthalene) Ether
3. Polyimide
4. Poly(benzocyclobutene) and perfluorocyclobutanes (BCB and PFCB)
5. Poly(quinoline)
6. Hydrido or Alkylsilsesquioxanes
7. Polytetrafluoroethylene (PTFE)-
8. Parylene-N, Parylene-F-.
9. Siloxanes
10. Organic substituted silazane
11. Quinoxaline These dielectric polymer materials include a significant increase in the organic material content over the $SiO_2$-based dielectric material. As also previously discussed, the conventional CMP conditions and slurries are much less effective as the organic content increases. Although the major focus has been on polymer materials, the low dielectric constant materials also can include porous dielectric materials, whether inorganic or organic and mixed organic and inorganic materials.

One particular low dielectric constant material which has been utilized for testing in accordance with the present invention is a poly(arylene)ether spin-on film, cured in a nitrogen atmosphere, yielding a dielectric constant of about 2.8 when measured at a frequency of one Megahertz. The dielectric material is stable, without substantial outgassing to a processing temperature of approximately four hundred (400) degrees Celsius, thus making this dielectric material compatible with the semiconductor wafer processing temperature requirements. The dielectric material has an effective gap fill at 0.12 microns for subtractive aluminum etch processing requirements. The conventional $SiO_2$ slurry utilized in the CMP process with this polymer dielectric material is essentially ineffective at removing the dielectric material.

The present invention demonstrates that this type of organic polymer dielectric material, as well as other low dielectric constant materials, effectively will be removed by means of a-chemical mechanical planarization mechanism making use of etchants and slurries having chemical properties tailored to the removal of the low dielectric constant material. A series of test specimens were prepared incorporating a cured spin-coated, organic dielectric film. The thermal bake and cure process used to prepare the films is as follows:

| Process Step | Description |
| --- | --- |
| 1 | 3 sec 0 rpm (dispense) |
| 2 | 5 sec 500 rpm (spread) |
| 3 | 60 sec 2000 rpm (spin) |
| 4 | Bake: 1 min @ 150 Celsius in $N_2$ |
| 5 | Cure: 1 hr @ 425 Celsius in $N_2$ |

The testing was performed in conventional single-head CMP processing equipment, such as an IPEC 472 made by IPEC Planar Corporation of Phoenix, Ariz., a fifteen (15) inch platen table top polisher by Engis Corporation of Wheeling, Ill., and a Teres polisher made by Lam Research Corporation of Fremont, Calif.

Figure 3:
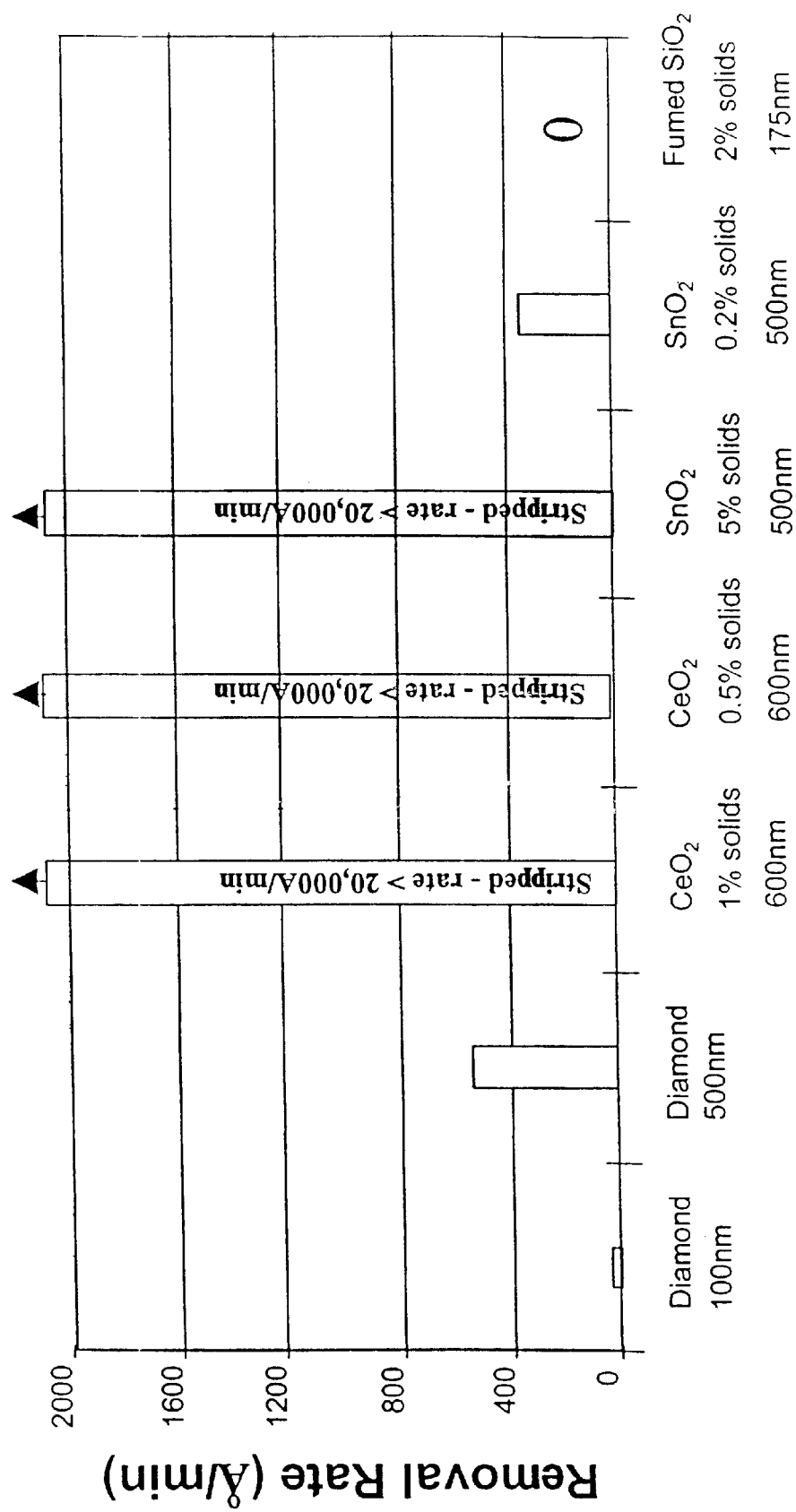
FIG. 3 is a graph of removal rates (in Ångstrom/minute) utilizing conventional abrasives on a low dielectric constant polymer material.

Referring to FIG. 3, the removal rate of the low dielectric constant polymer material, utilizing some conventional abrasives is illustrated. These abrasives were dispersed in de-ionized (DI) water only and no chemical additives were utilized to enhance their performance. CMP was performed for two (2) minutes at a polishing pressure of $23 \times 10^3$ Pa (approximately 3.3 pounds per square inch (psi)) and a linear velocity of 0.48 meters per second (m/s). The hardest abrasive is diamond and if the mechanical aspects were solely responsible for the dielectric material removal, then the one hundred (100) or five (500) nanometer (nm) diamond abrasives should have produced the greatest rate of removal. This clearly doesn't happen. The fumed amorphous $SiO_2$ manufactured by a conventional flame hydrolysis technique produced no dielectric polymer material removal and in fact had no visible effect on the dielectric polymer material. The chemically active oxide abrasive particles, cerium oxide ($CeO_2$) and stannic oxide ($SnO_2$) completely removed all of the dielectric polymer material and repeated tests proved that the material was stripped within seconds. This uncontrollable removal is undesirable, but clearly suggests a mechano-chemical removal mechanism. Since a controlled and precise removal rate is required for the CMP process, the conventional abrasives illustrated in FIG. 3 are unacceptable.

FIG. 3 illustrates that material removal occurring at too fast a rate or at too slow a rate are both undesirable. Thus, one important objective of the present invention is to provide abrasive slurries for CMP, and CMP processing conditions, that lead to a controllable rate of material removal for organic and other low dielectric constant materials. That is CMP slurries and condition are desired that result in planarization removal rates allowing planarization to occur in reasonably short time periods (typically minutes) but not so rapidly that precise control of the process is lost.

Figure 4:
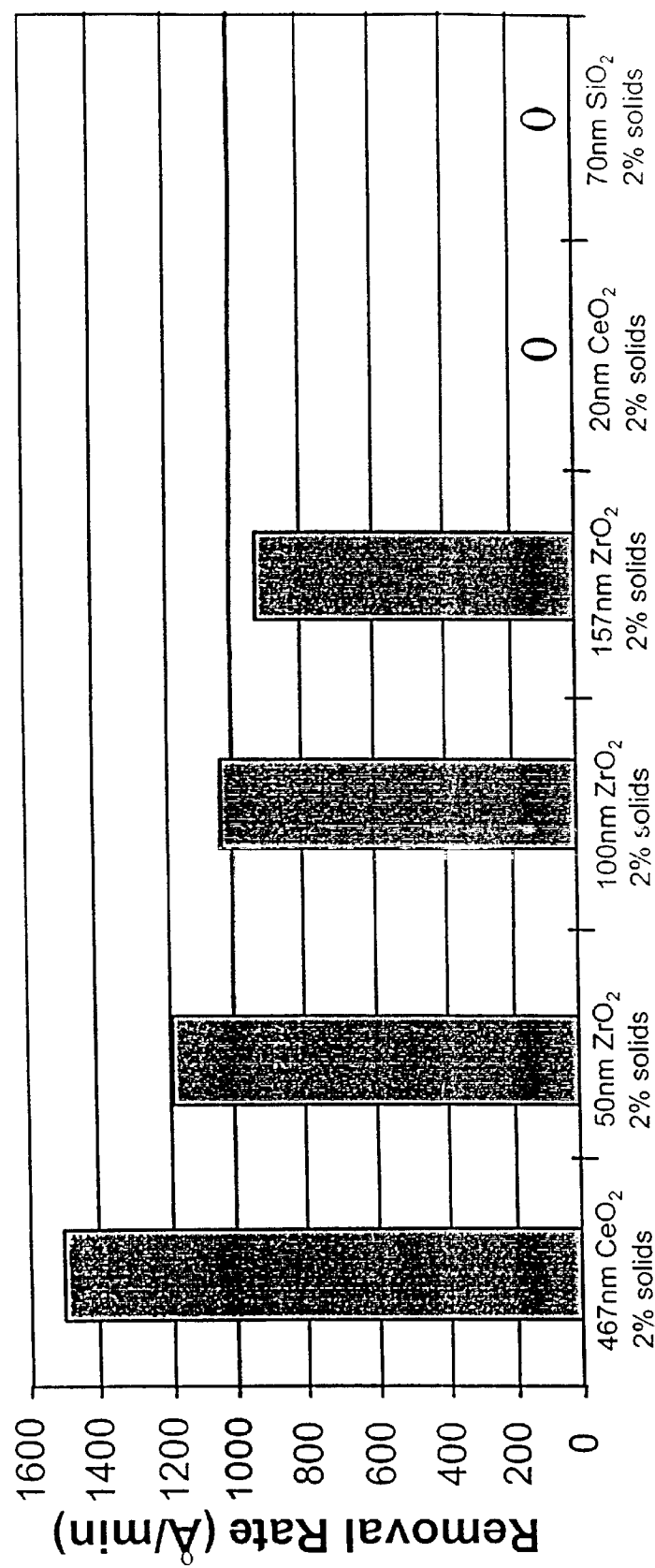
FIG. 4 is a graph of removal rates utilizing the aqueous metal oxide sol slurries of the present invention.

Applicants selected and tested a series of specially prepared abrasives according to the present invention and compared the results to the CMP results obtained with conventional abrasives depicted in FIG. 3. Because of the unique microstructure and chemical attributes of the aqueous metal oxide sols of the present invention, the resulting slurry achieved significantly different etching results, as illustrated in FIG. 4, indicating substantially different CMP polishing properties. In one embodiment of this invention, the abrasive particles are formed by well-known methods for the production of sols. Examples of such methods are disclosed in U.S. Pat. Nos. 3,282,857; 4,588,576; 5,004,711 and 5,238,625. Abrasive slurries derived from these sol methods can be tailored such that the slurry includes individual and segregated primary particles, or if so desired, the particle size can be grown to the desired dimension in a repeatable, controlled fashion. The aqueous metal oxide sols were dispersed in de-ionized (DI) water to form the slurries. The pH of each suspension was adjusted to impart colloidal stability to the slurry. The polishing pressure was the same, $23 \times 10^3$ Pa and the linear velocity was also the same, 0.48 m/s.

Comparing the $CeO_2$ 467 nm particle size rate in FIG. 4 to the $CeO_2$ 600 nm size in FIG. 3 illustrates a significantly lower controllable removal rate for the slurry embodiment of the present invention. The concentration was twice as great in FIG. 4, two (2) per cent solids by weight in the solution versus one (1) per cent in FIG. 3, which would logically result in an even greater removal rate for the 467 nm particles. Three different zirconium dioxide ($ZrO_2$) size results are illustrated. The 20 nm $CeO_2$ size particles had no effect on the dielectric polymer material indicating the possibility of a critical particle diameter threshold. This possibility relates to the physical interaction between the abrasive particles 30 and the pad 16. Very small diameter particles may not project or extend beyond the microstructure of a compliant pad 16 and hence the surface of the pad 16 may directly contact the wafer surface 40. This contact tends to reduce the load supported by the abrasive particles and hence reduces the cumulative contact area of the abrasive particles.

A 70 nm $SiO_2$ sol was also tested and again resulted in effective removal of the dielectric polymer material. To illustrate the theory that the chemical reaction is important with these dielectric polymer materials, conventional oxidizing agents were added to the $SiO_2$ sol slurry and an effective removal rate of about 900 Ångstroms/minute (Å/min) was obtained.

Applicants discovered that the effective and controllable removal rates illustrated in FIG. 4 are obtained by utilizing non-dehydrated chemically active, aqueous metal oxide sol particle slurries. These metal oxide materials are formed by precipitating the materials in solution. Applicants have discovered that these metal oxide particles, which are maintained in solution and never dried, defined for purposes herein as "non-dehydrated", are chemically active (that is, chemically reactive with the low dielectric constant films being tested) and produce different CMP results than similar metal oxide particles made by other processes or which have been dried after formation. The particles preferably are maintained in a colloidal suspension or dispersion. "Chemically active" or "active" as used herein means materials that chemically react with the material to be planarized, including but not limited to one or more of the following oxides and group of oxides: lanthanide oxides, $Al_2O_3$, $CeO_2$, $Sb_2O_5$, $SnO_2$, $ZrO_2$, $Cr_2O_3$, $MnO_2$, $MgO_2$, $ZnO$, $Fe_2O_3$, $HfO_2$ and $TiO_2$. Routine experimentation as described herein may be used to determine chemical activity (or its absence) for any candidate CMP slurry material and dielectric material to be planarized. "Chemically inactive" or merely "inactive" is used herein to mean not chemically reactive with the dielectric material to be planarized.

Figure 5C:
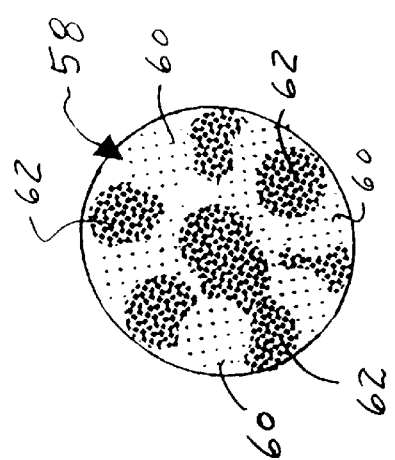
FIGS. 5A, 5B and 5C are schematic depictions (not to scale) cross sectional views of typical abrasive particles pursuant to some embodiments of the present invention.
Figure 5B:
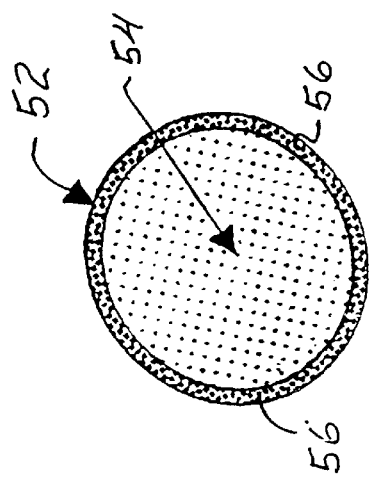
Figure 5A:
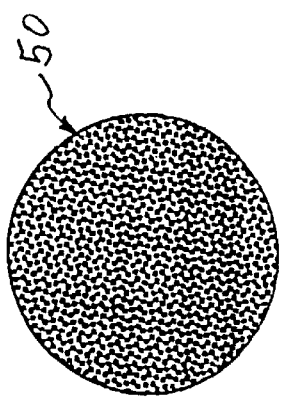

Applicants first utilized a slurry containing monoclinic $ZrO_2$ particles 50 as illustrated in FIG. 5A. These particles are formed in solution and appear to be a body of loosely coalesced smaller particles of monoclinic $ZrO_2$. These particles are produced, for example, by Nyacol Products Inc. of Ashland, Mass., a wholly owned subsidiary of The PQ Corporation, and sold in a twenty (20) per cent concentration (by weight) aqueous solution to customers for utilization as catalysts in chemical processes unrelated to CMP. The loose aggregate particle 50 has an effective density on the order of about 4.5 (estimated). Fully dense calcined $ZrO_2$ has a density of about 5.7. Once these oxide particles are dried, or if produced by a dry technique, it appears that the hydrated metal oxide structure 50 is changed and the CMP characteristics also are changed, as illustrated in FIG. 3.

Applicants designed and tested another hydrolized structure 52, as illustrated in FIG. 5B. The particle 52 was manufactured by EKA Chemicals Inc. of Marietta, Ga. which is owned by AKZO Nobel of Sweden and sold in hydrated form containing the particles 52. The particle 52 has a core 54 formed from inactive $SiO_2$; however, the core 54 then is coated in solution by an active metal oxide $ZrO_2$ forming a shell 56. $SiO_2$ has a much lower density on the order of 2.2 than $ZrO_2$. The effective density of the coated particle 52 was estimated to be on the order of 2.8. Within practical limits, the density of the particle 52 can be tailored by the relative amounts of the two oxides in the particle 52. The density of the particles 52 is important, because for a given weight percent of particles in the slurry, the lower density particles 52 will be numerically higher in number. An increase in the number of the particles 52 increases the polishing contact area and hence increases the material removal rate.

A third composite particle 58 also can be formed, as illustrated in FIG. 5C. The particle 58 is coprecipitated from a mixture of $SiO_2$ and $ZrO_2$, for example, and results in a mixed phase composite particle having regions 60 of $SiO_2$ intermixed with regions 62 of the active metal oxide, here $ZrO_2$.

The metal oxide particles 50, 52 or 58 are very spherical in shape and the metal oxide colloids are formed and preferably retained in a pH stabilized aqueous solution, which both maintains the particle spherical shape and maintains a dispersive particle suspension or dispersion where the particles do not form agglomerates. The slurry pH also preferably is adjusted to maintain a stable liquid colloid suspension. Since the metal oxide sol particles are essentially spherical, the particles exhibit very repeatable and predictable contact stress behavior in the CMP or other polishing processes. Regardless of the orientation, the radius of the contacting particle abrasive body is approximately one half the particle diameter. The dimensionally stable spherical shape also will not significantly change over time due to physical wear during normal CMP processes. Conventionally formed abrasives typically have hard and sharp angles, ridges or points and hence can exhibit very localized high stress points. The mechanically soft or ductile dielectric polymer material and porous dielectrics are subject to polishing defects, such as micro-cutting and plowing, wedge formation or crazing defects. The uniform loading of the spherical "soft" oxide particles of the present invention significantly reduce the possibilities of such defects. The sol particles are heavily hydrated and can be amorphous or have some short range order, for example, the $ZrO_2$ can be monoclinic in structure. The particles of the present invention are mechanically soft and less dense than the conventional precipitated-calcined abrasive particles formed from the same metal oxide materials. Because of the lower modulus and lower density of the particles of the present invention, they are less prone to cause surface damage and are easier to maintain in a stable suspension, since they will settle less rapidly than the conventional more dense particles in accordance with Stokes Law.

The particle size distribution of the present invention can be very tightly controlled and CMP slurries with very small particles on the order of less than one hundred (100) nm can be economically and repeatedly manufactured in the sol production method. Further, because of the spherical shape, the resulting CMP slurries are very amenable to filtration. Contaminants can be entrained in filter media, while the colloidal metal oxide particles pass through the filter media. Although designed to most efficiently remove high organic content polymer dielectric material, the metal oxide slurries of the present invention also can be utilized to remove inorganic materials or mixtures of the two of varying concentrations in the low dielectric constant materials.

Although the tests so far indicate that introducing the aqueous metal oxide sols to the surface of the dielectric polymer material in a liquid slurry form is optimal, other fixed abrasive embodiments could be utilized. The aqueous metal oxide sol could be in a gel form and could be bonded directly to the surface of or incorporated within a suitably thick compliant polishing substrate in a separate manufacturing process. This could eliminate the liquid slurry, since the abrasive coated compliant substrate could act as the fixed abrasive polishing pad. The technique could also be extended to incorporate the metal oxide sol into a polymeric matrix within the bulk of or at the surface of the polishing pad 16. A combination of these approaches may be optimal for some applications.

For the metal oxide particles of the present invention, the diameter range for polishing the low dielectric constant materials is on the order of three (3) nanometers (nm) up to one thousand (1000) nm (or one micron), preferably on the order of fifty (50) nm to two hundred and fifty (250) nm. The concentration of the particles in the slurry solution by weight percent (wt %) is from about one tenth (0.1) to thirty (30) percent; preferably two (2) to fifteen (15) percent. The structure of the $ZrO_2$ particles is of a short range order, such as tetragonal, cubic, monoclinic or substantially no order, amorphous. Other oxide materials of the present invention may include other structural forms. The pH preferably is adjusted to maintain a stable colloid suspension, essentially the pH is adjusted to obtain the required zeta potential on the surface of the oxide particles. For the metal oxide particle of the present invention, the pH is on the order of one half (0.5) to eleven (11) and preferably on the order of two and one-half (2.5) to four (4).

For the CMP process, various speeds and pressures are utilized depending upon the type of CMP device or process. The pressure and speed parameters typically vary with one another, in simple effect a doubling of either parameter will double the removal rate. However, at some high speed and with low enough pressure, the CMP process can reach a speed interaction equivalent to hydroplaning and very little, if any, dielectric material will be removed.

Figure 6:
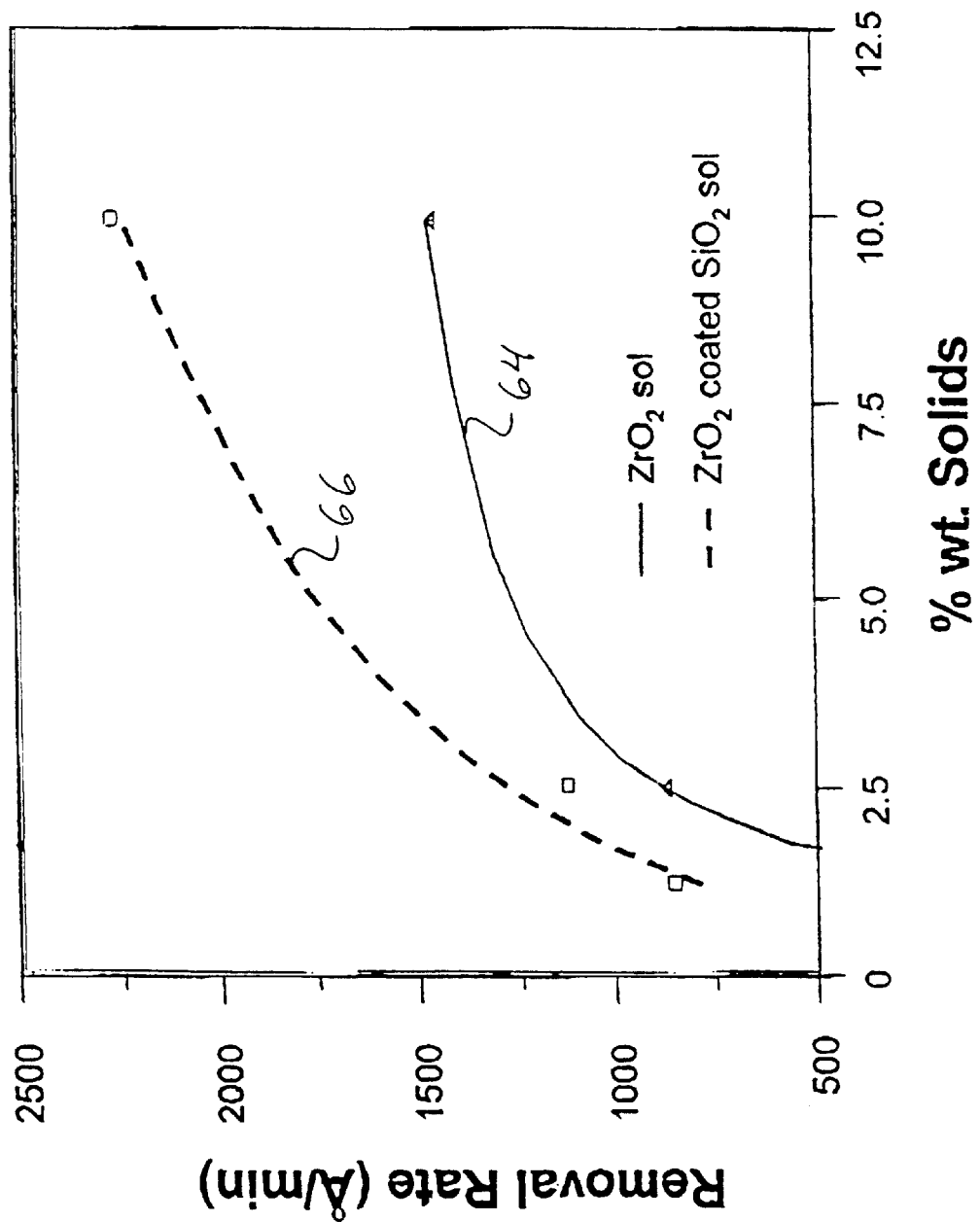
FIG. 6 is a graph depicting the removal rates, utilizing two different particle structure embodiments of the present invention.

The metal oxide particles 50 and 52 were tested in the CMP process with the removal rate results illustrated in FIG. 6, by respective curves 64 and 66. The curves 64 and 66 were developed by increasing the percentage by weight (% wt) of the same size particles 50 and 52 in the respective slurries. Since the particles 52 are less dense than the particles 50, more particles are contained in the slurry with the particles 52 at an equivalent % wt. It would be expected that an increase in the number of particles 50 or 52 in the respective slurry would increase the efficiency of the CMP process, as is indicated by each of the curves 64 and 66.

Figure 7A:
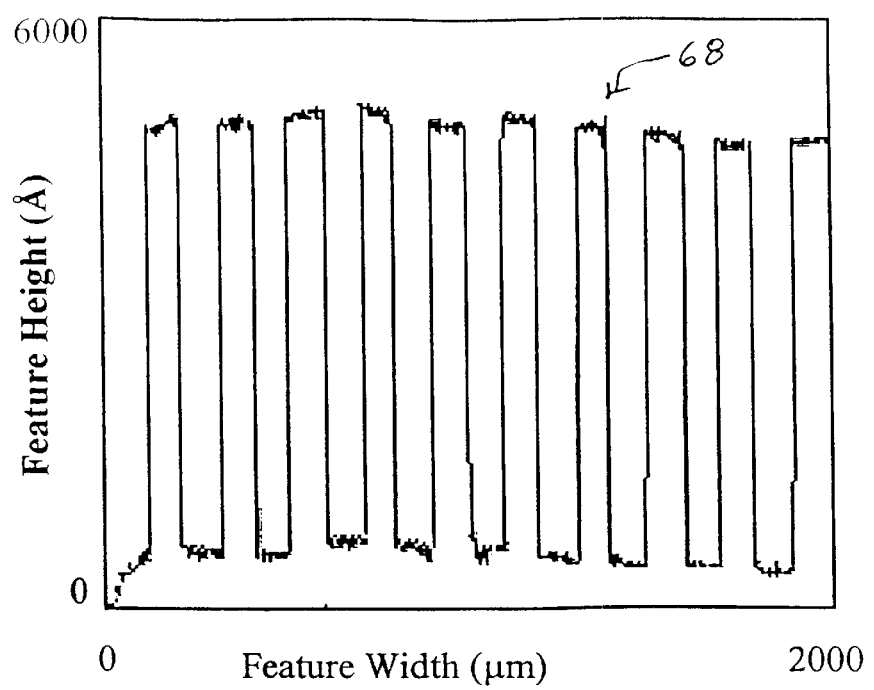
FIGS. 7A and 7B are graphs depicting the planarization resulting from utilization of one embodiment of aqueous metal oxide sol slurry of the present invention.
Figure 7B:
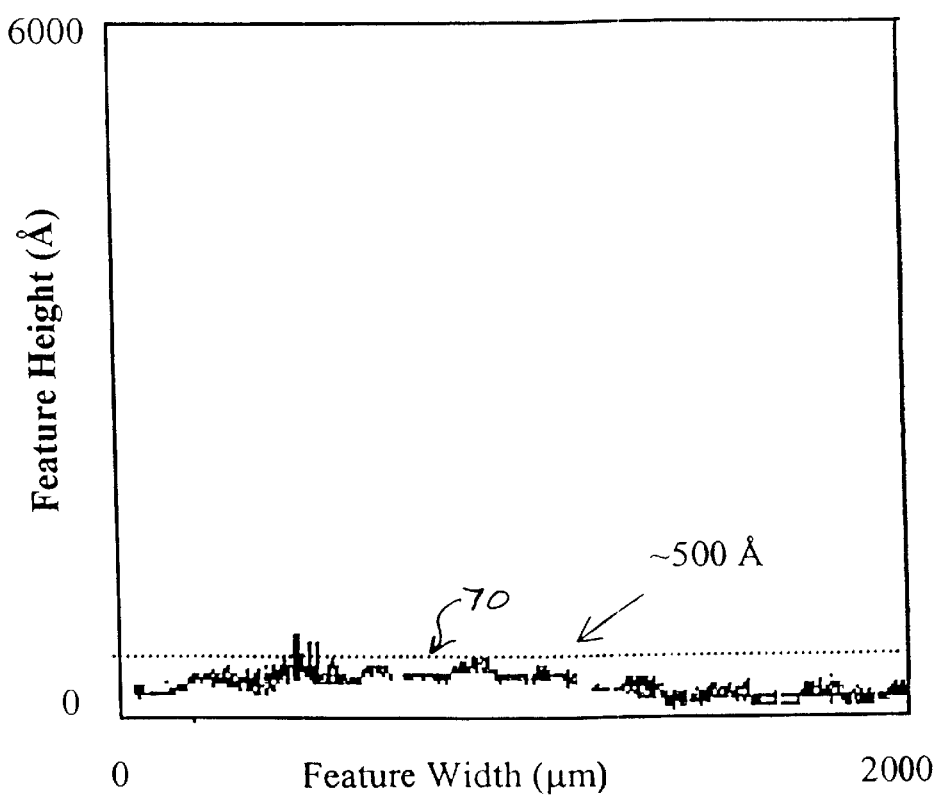

The solid $ZrO_2$ particles 50 of 157 nm diameter were utilized in the CMP process for low dielectric constant polymer material removal and then the surface was tested to obtain planarization data as illustrated in FIGS. 7A and 7B. This data indicates that acceptable step-height reduction in the dielectric polymer material should be obtainable by the slurries of the present invention. As illustrated in FIG. 7A, a test pattern was formed on a structure (not illustrated) including ten (10) 100 $\mu$m×100 $\mu$m structures spaced 100 $\mu$m apart having an initial step height (like 46 in FIG. 2) amount (above the intermediate surface 48) of approximately five thousand (5000) Ångstroms. A profilometer trace 68 of the pattern is illustrated in FIG. 7A. The CMP process was performed for two (2) minutes, at a polishing pressure of 23×10³ Pa, a linear velocity of 0.48 m/s and a fifty (50) milliliter per minute (ml/min) slurry flow rate. A resulting profilometer trace 70 is illustrated in FIG. 7B, which illustrates an acceptable step height reduction and a final step height of less than approximately five hundred (500) Ångstroms.

Figure 8A:
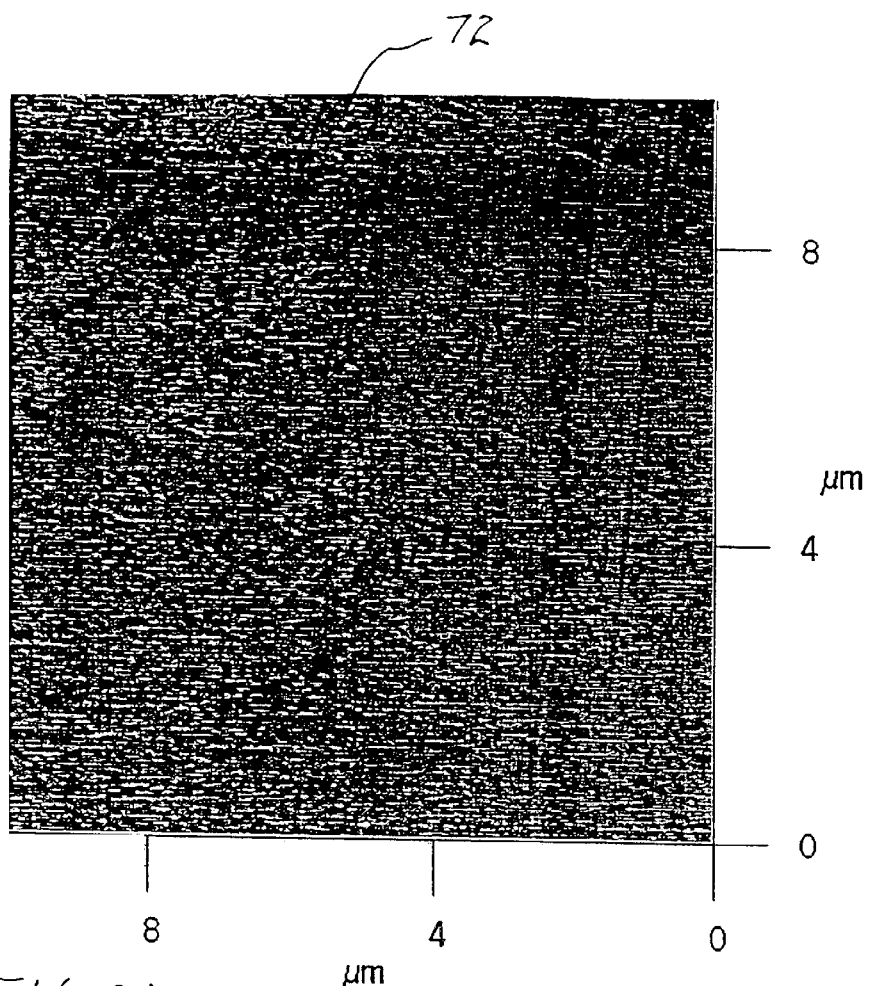
FIGS. 8A and 8B depict results of a CMP process of the present invention performed on a surface of a low dielectric constant polymer material.
Figure 8B:
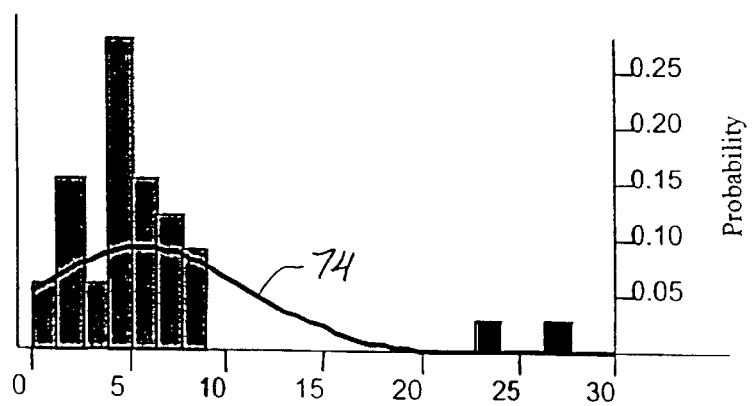

A variety of speeds, pressure and time combinations were evaluated and a plurality of spaced apart locations on the test wafer were evaluated to enhance the statistical confidence in the CMP results. The surface microstructure of the surface 40 of the low dielectric constant polymer material was evaluated by atomic force microscopy (AFM) in non-contact mode and by Scanning Electron Microscopy (SEM). Roughness data later was obtained utilizing a 10 $\mu$m×10 $\mu$m area as illustrated in FIGS. 8A and 8B. FIG. 8A illustrates a resulting surface 72 for the CMP process of the present invention utilizing the $ZrO_2$ slurry. FIG. 8B illustrates a graph 74 of the roughness data obtained from thirty-two (32) other sample surfaces polished under varying CMP process conditions utilizing the $ZrO_2$ slurry. The roughness data from these samples is as follows:

| Mean | 5.85 | Sum Weights | 32.00 |
|---|---|---|---|
| Std Dev | 5.43 | Sum | 187.21 |
| Std Error Mean | 0.96 | Variance | 29.46 |
| Upper 95% Mean | 7.81 | Skewness | 3.00 |
| Lower 95% Mean | 3.89 | Kurtosis | 9.81 |
| N | 32.00 | CV | 92.78 |

The data illustrates that ninety five (95) per cent of these samples have roughness values below 7.8 Ångstrom root mean square (rms) with a mean of 5.9 Ångstroms. Two high (outlier) results were shown to be due to residual slurry particles, rather than the actual surface texture. With those two results excluded, the mean was 4.6 Ångstroms. The raw values were not significantly different with varying pressure, particle diameter and abrasive solids concentration.

Figure 9:
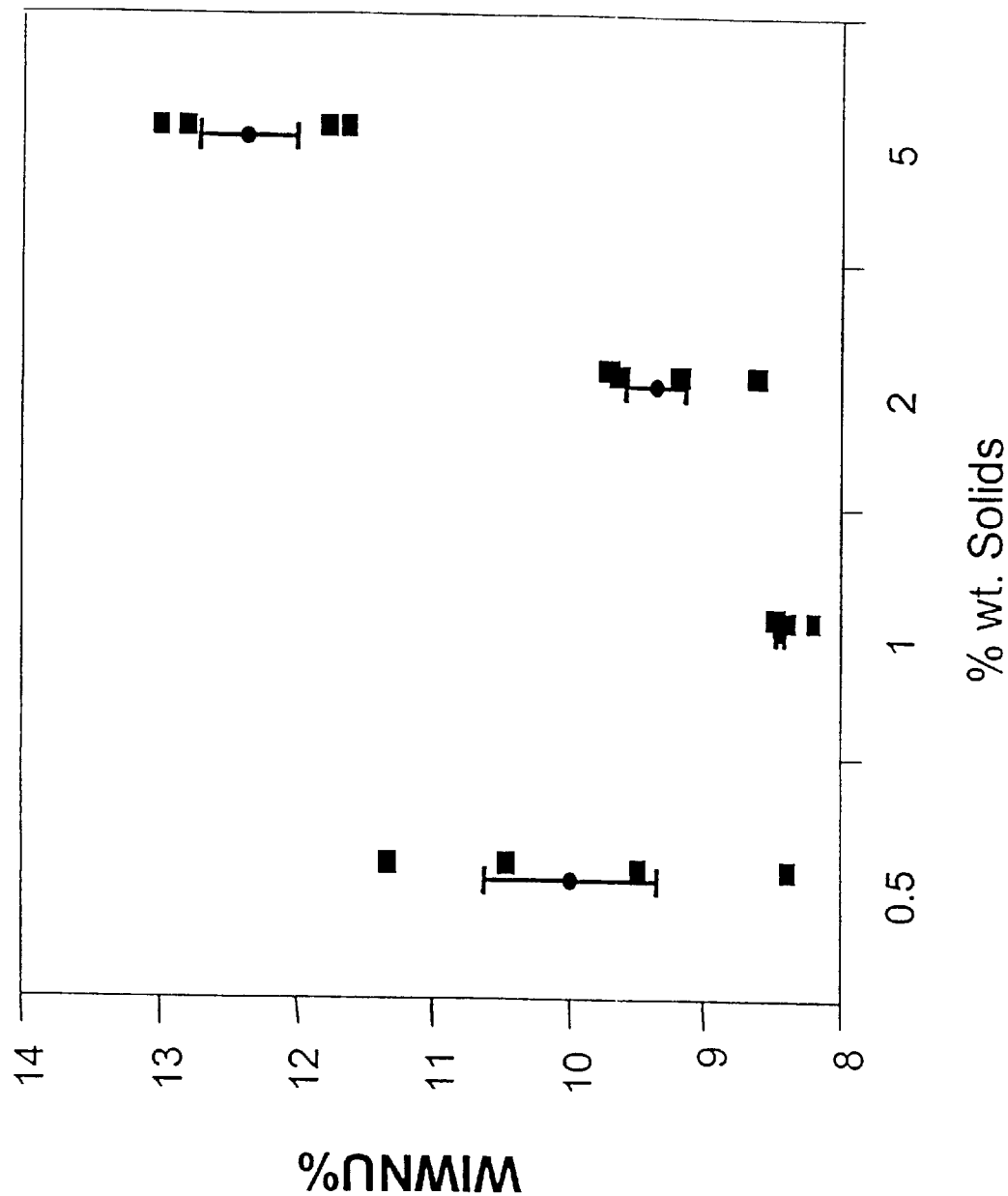
FIG. 9 depicts the effect of abrasive solids concentration on within wafer non-uniformity ("WIWNU").

Referring to FIG. 9, the WIWNU % page 18, line 28: Insert immediately following "WIWNU %" the following— (Within Wafer Non-Uniformity %)—is illustrated as a function of increasing abrasive solids (% wt) in the $ZrO_2$ slurry. This WIWNU % reaches a local minimum at about one (1) % abrasive solids concentration.

Figure 10:
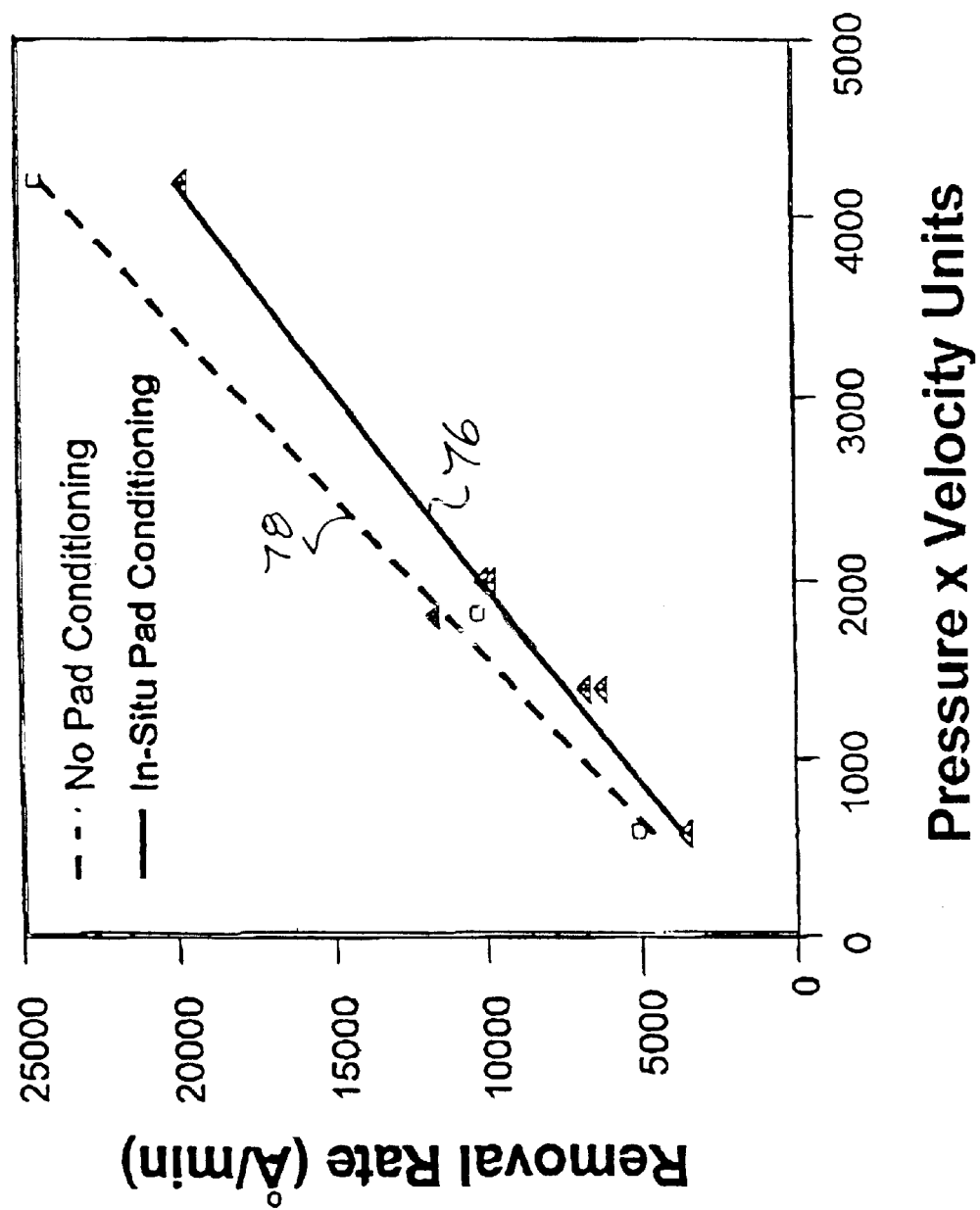
FIG. 10 depicts the effect of pad conditioning on the CMP process planarizing a low dielectric constant polymer material.

As described with respect to FIG. 1, the conventional CMP process utilizes a conditioning process/conditioner 26. Referring to FIG. 10, the linear dependence of the dielectric polymer material removal rate on the mechanical work expended is illustrated. A first linear dependence line 76 for the CMP process with in situ conditioning is illustrated along with a second line 78 for CMP processing without any conditioning. These lines 76, 78 were developed over a wide process margin of pressures between three (3) and seven (7) psi and linear velocities between two (2) and six (6) hundred ft/min.

Figure 11:
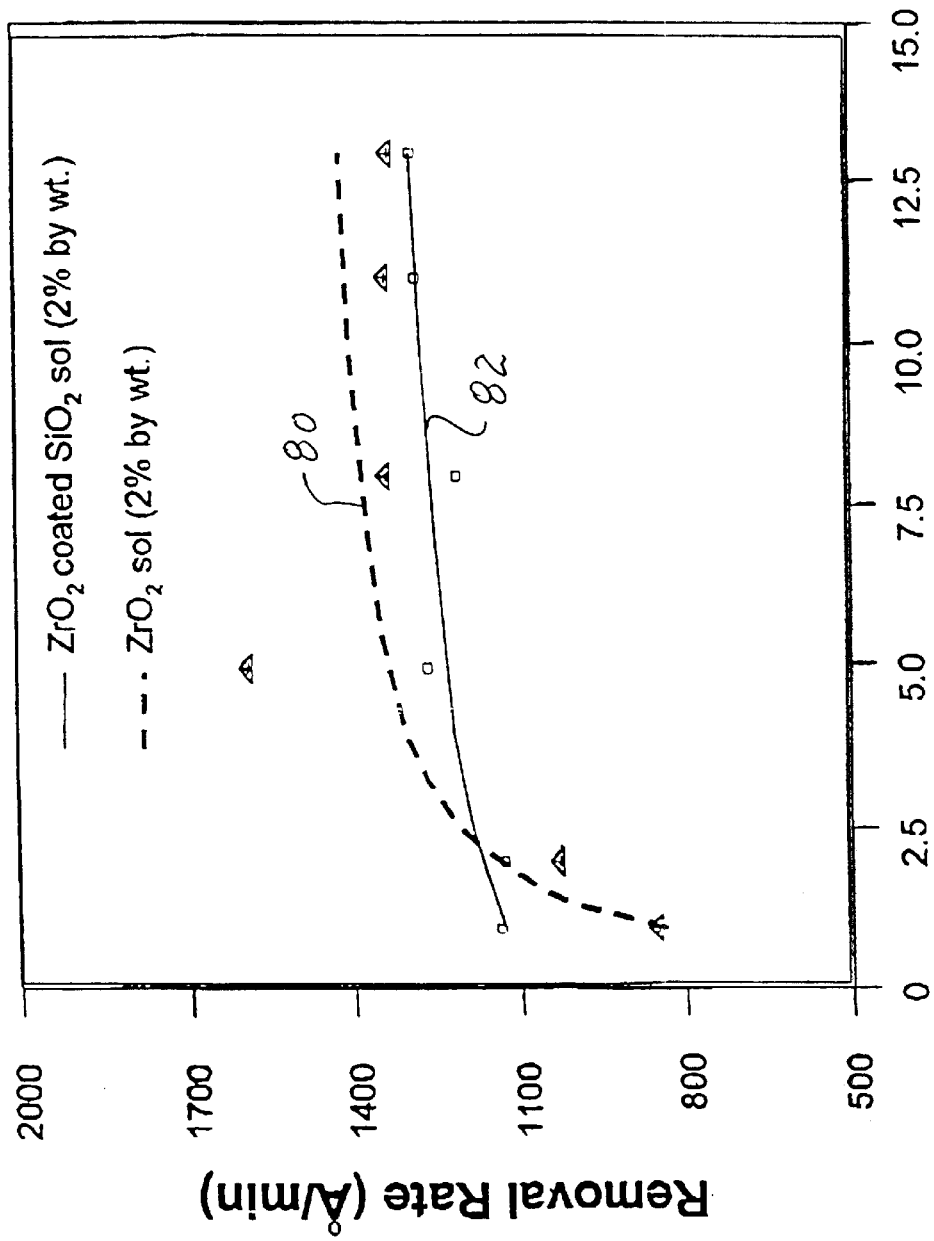
FIG. 11 depicts the CMP removal rate of the low dielectric constant polymer material without pad conditioning for different abrasives.

The removal rate without pad conditioning for the CMW process utilizing the particles 50 and 52 is illustrated in FIG. 11. The $ZrO_2$ particles 50 generated a curve 80, while use of the coated particles 52 resulted in a curve 82. Each of these CMP processes actually maintain and somewhat increase the removal rate of the dielectric polymer material without pad conditioning. This increased removal rate is in direct contrast to the conventional $SiO_2$ slurry process, which removal rate will decrease dramatically without pad conditioning.

Figure 12:
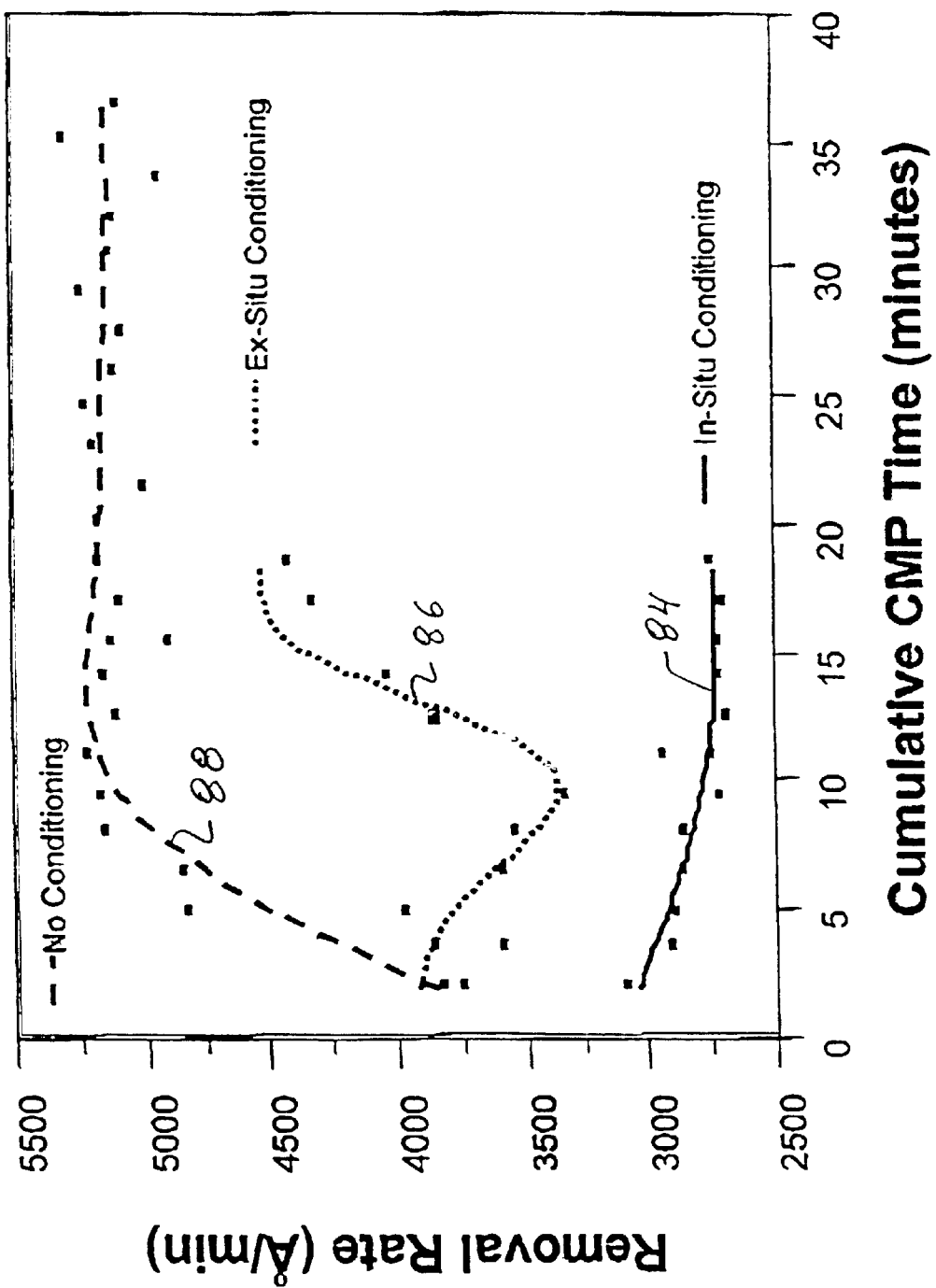
FIG. 12 depicts the CMP removal rate with different pad conditioning methods.

Referring to FIG. 12, the dielectric polymer material removal rate for the CMP process utilizing the $ZrO_2$ slurry is indicated for in-situ pad conditioning, a curve 84; ex-situ pad conditioning using de-ionized water as the pad conditioning fluid, a curve 86 and no conditioning, a curve 88. It is postulated that the metal oxide slurries of the present invention may build up on the pad 16, such that the pad 16 presents a more uniform abrasive surface, which could be indicated by the essentially constant removal rate of the curve 88 after about ten (10) to fifteen (15) minutes.

Figure 13:
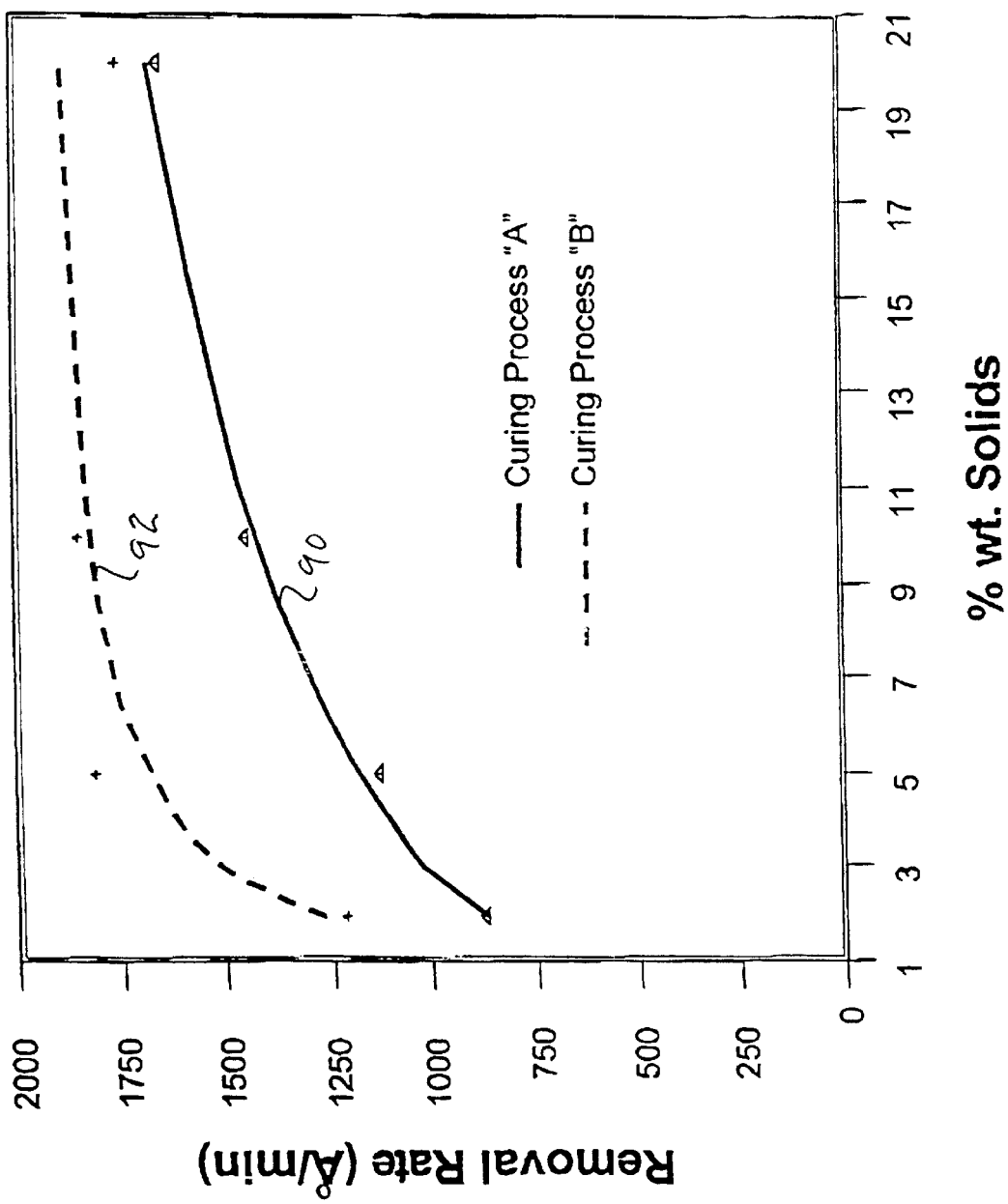
FIG. 13 depicts the effects of the cutting process employed on the low dielectric constant polymer material on the material removal rates resulting from planarization by CMP pursuant to the present invention.

One further effect on the metal oxide CMP process of the present invention is illustrated in FIG. 13. The curing process of the dielectric polymer material effects the CMP process of the present invention. As illustrated, a curing process A results in a removal rate curve of 90. A curing process B results in an increased removal rate curve 92. The process A utilized a curing temperature of 375° C. for a time of one (1) hour. The process B utilized a higher curing temperature of 425° C. for a time of one (1) hour. The increased curing temperature actually increased the removal rate of the dielectric material. This result was for one specific low dielectric constant polymer material, utilizing a $ZrO_2$ slurry embodiment of the present invention.

The metal oxide slurry of the present invention preferably is formed having a multi-modal particle size distribution of one or more sets of small diameter particles combined with one or more sets of larger diameter particles. Most preferably, the slurry has a bi-modal particle distribution with a first set of small diameter particles and a second set of larger diameter particles. The small diameter particle mode is centered from about 5 nm to 45 nm, and preferably at about 20 nm. The large mode is centered from 40 nm to as large as desired, but typically about 250 nm diameter particles (40 nm–250 nm) and preferably 50 nm–150 nm. The distribution is such that typically 98% of the particles (by number) reside in the small particle mode. However, this value can range such that in one example only 10% of the particles by number are contained in the small particle mode. The preferable percentage of particles residing in the small particle mode is between 90% and 100% U.S. Pat. No. 5,527,370 discloses that a bi-modal particle size distribution provides a higher grinding rate and better surface finish for metals and inorganic materials than a mono-disperse abrasive system. Applicants believe this also to be the case for polishing the low dielectric constant materials described herein.

Figure 14:
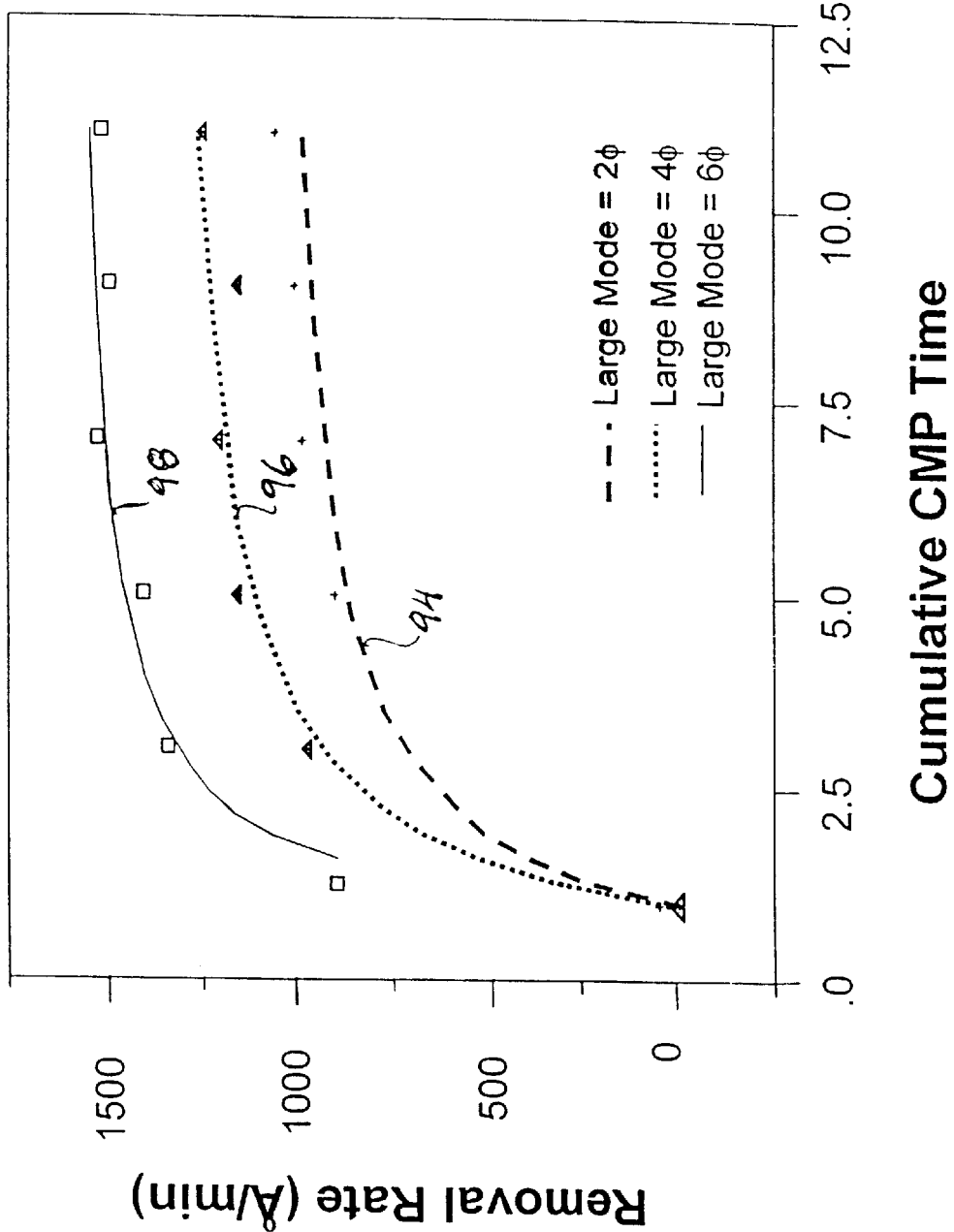
FIG 14 depicts the CMP removal rates resulting from the use of different bi-model particle distributions of the present invention.

The removal rate for three different bi-modal $ZrO_2$ sol embodiments of the present invention are illustrated in FIG. 14. A first curve 94 shows the removal rate results of a bi-modal $ZrO_2$ particle sol, having ninety-eight (98) percent of the particles in the small particle mode and having a diameter of twenty-five (25) nm. The large diameter mode particles have a diameter of fifty (50) nm (twice the size of the small particles) and form two (2) percent of the particles.

A second curve 96 shows the results of the large mode particles being of a diameter of one hundred (100) nm (four times the size of the small particles), still forming two (2) percent of the $ZrO_2$ particles. A third curve 98 shows the results of the large mode particles being of a diameter of one hundred and fifty (150) nm (six times the size of the small particles). The removal rate data clearly shows that increasing the diameter of the large mode particles increases the removal rate.

Figure 15:
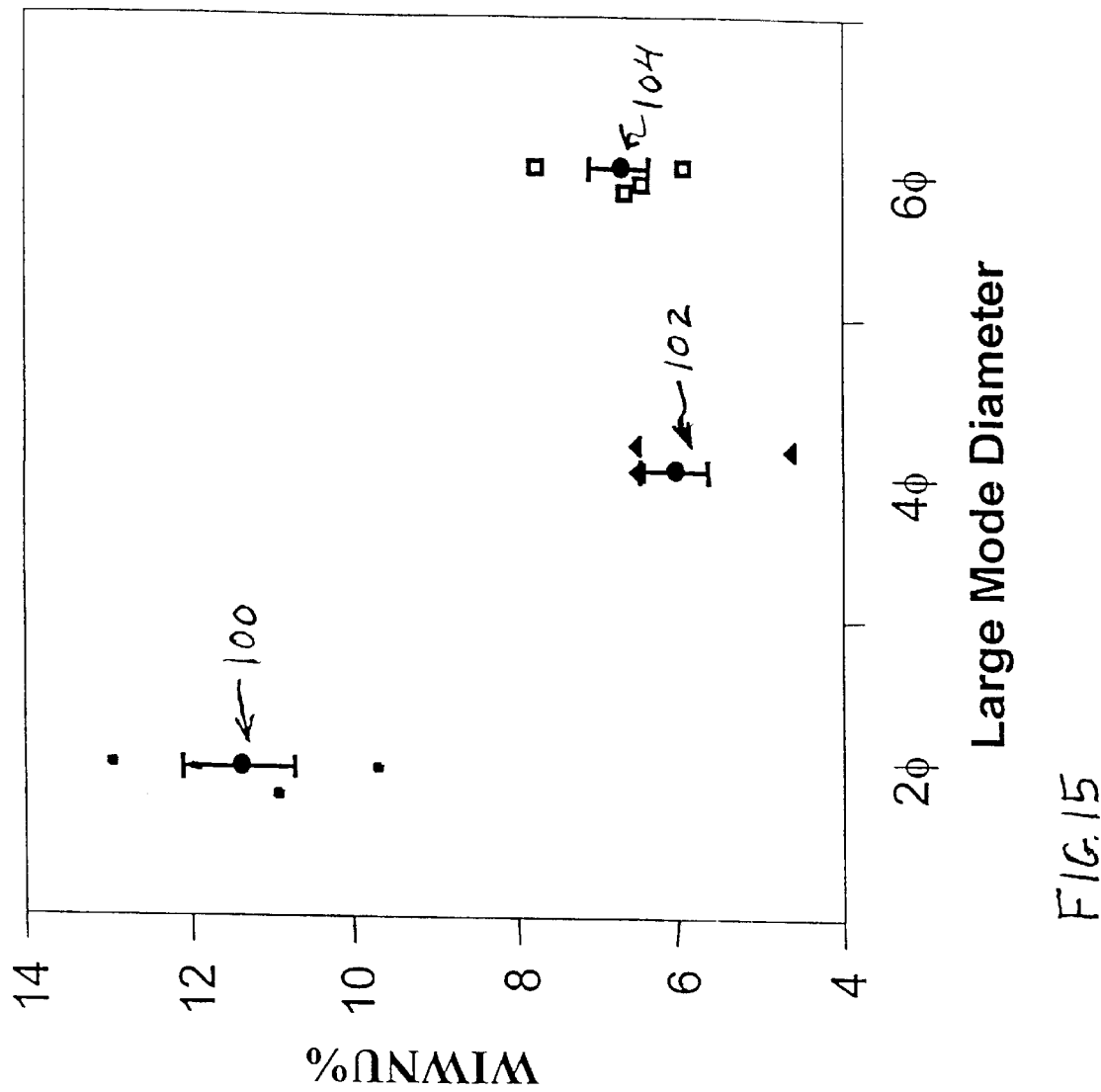
FIG. 15 depicts the effects of use of a bi-model particle distribution pursuant to the present invention on within wafer non-uniformity.

FIG. 15 illustrates the WIWNU % for the bimodal slurries utilized to obtain the results in FIG. 14. The examples represented by the curve 94 are illustrated by a data grouping 100. The WIWNU % is improved by utilizing the larger particle bimodal distribution as illustrated by a data grouping 102, corresponding to the data of the curve 96 and a data grouping 104, corresponding to the data of the curve 98.

The metal oxide particles of the present invention can be formed from one or more of the following oxides and group of oxides: lanthanide oxides, $Al_2O_3$, $CeO_2$, $Sb_2O_5$, $SnO_2$, $ZrO_2$, $Cr_2O_3$, $MnO_2$, $MgO_2$, $ZnO$, $Fe_2O_3$, $HfO_2$ and $TiO_2$. The particles are not necessarily one hundred percent pure and can also purposely be formed from a combination of the metal oxides. The core 54 essentially can be any material which can be coated with the metal oxides of the present invention. Small amounts of other materials also can be utilized, if desired. The inactive oxide core 54 or mixture 60 can be $SiO_2$ or can be other oxides or other low density materials as desired. Although specific oxides are listed, the present invention also includes other suitable oxidation states of these metals, page 21, line 13: A description of the various oxidation states of these metals may be found in various references on inorganic chemistry including (for example) *Advanced Inorganic Chemistry* by F. Albert Cotton and Geoffrey Wilkinson, (John Wiley and Sons, Fourth Ed., 1980). In particular, in the cited reference see Chapter 8 (Mg), Chapter 10 (Al), Chapter 12 (Sn), Chapter 14 (Sb), Chapter 19 (Zn), Chapter 21 (Cr, Mn, Ti, Fe), Chapter 22 (Zr, Hf) and Chapter 23 (lanthanides and Ce).

Although the present invention has been described with reference to particular embodiments, the described embodiments are examples of the present invention and should not be taken as limitations. For example, the metal oxide particles of the present invention have been described as being preferably maintained in a stable colloidal suspension or dispersion; however, the particles could be in gel form and the particles also could be adhered to or be formed as part of the surface of the pad 16 (not illustrated). A combination of these features also could be utilized. Also, although the pad 16 has been illustrated as a rigid platen mounted polishing pad, it can include any semi-rigid surface, such as formed on or part of a rotating sphere, rod or cylinder, belt or pad, etc. (not illustrated) As will be appreciated by those skilled in the art, various other adaptations and combinations of the embodiments described herein are within the scope of the present invention as defined by the attached claims.

We claim:

1. A gel composition for polioshing a low dielectric constant material, comprising:
    a plurality of aqueous abrasive particles comprising at least one metal oxide that is chemically reactive with the low dielectric material, wherein the plurality of particles are formed directly in a solution and wherein the plurality of particles are retained in the solution before formation of the gel composition.

2. The gel composition of claim 1, wherein the at least one metal oxide comprises lanthanide oxides, aluminum oxides, cerium oxides, antimony oxides, tin oxides, zirconium oxides, chromium oxides, manganese oxides, zinc oxides, iron oxides, hafnium oxides, titanium oxides or mixtures thereof.

3. The gel composition of claim 2, wherein the at least one metal oxide comprises $Al_2O_3$, $CeO_2$, $Sb_2O_5$, $SnO_2$, $Cr_2O_3$, $MnO_2$, $ZnO$, $Fe_2O_3$, $HfO_2$, $TiO_2$ or mixtures thereof.

4. The gel composition of claim 1, further comprising at least one oxide that is chemically unreactive with the low dielectric contact material.

5. The gel composition of claim 4, wherein the chemically unreactive oxide is $SiO_2$.

6. The gel composition of claim 2, wherein the at least one metal oxide comprises $ZrO_2$.

7. The gel composition of claim 6, wherein the $ZrO_2$ abrasive particles are monoclinic $ZrO_2$.

8. The gel composition of claim 1, wherein the abrasive particles have a diameter from approximately 3 nanometers to approximately 1,000 nanometers.

9. The gel composition of claim 8, wherein the abrasive particles have a diameter from approximately 50 nanometers to approximately 250 nanometers.

10. The gel composition of claim 1, wherein the abrasive particles have a multi-modal size distribution.

11. The gel composition of claim 10, wherein the abrasive particles have a bi-modal size distribution, including a plurality of small diameter particles and a second lesser amount of a plurality of large diameter particles.

12. The gel composition of claim 11, wherein the mode of the smaller diameter particles is from about 5 nanometers to about 45 nanometers and the mode of the large diameter particles exceed about 40 nanometers.

13. The gel composition of claim 12, wherein the small diameter particle mode is about 20 nanometers.

14. The gel composition of claim 12, wherein the large diameter mode is from about 40 nanometers to about 250 nanometers.

15. The gel composition of claim 14, wherein the large diameter particle mode is from about 50 nanometers to about 150 nanometers.

16. The gel composition of claim 12, wherein more than approximately 90% of the particles comprise small diameter particles.

17. A low dielectric constant material prepared using the gel composition of claim 1.

18. The low dielectric constant material of claim 17, wherein the material has a dielectric constant of less than about 2.8.

19. The low dielectric constant material of claim 17, wherein the material comprises an organic compound.

20. The low dielectric constant material of claim 19, wherein the organic compound comprises an organic polymer.

21. The low dielectric constant material of claim 7, wherein the low dielectric constant material comprises at least one material that comprises poly(arlene)ether, poly(naphthalene)ether, polimid, poly(benzocyclobutene), perflourocyclobutane, poly(quinoline), hydridosilsesquixane, alkylsilsesquioxane, polytetrafluoroethylene, parylene-N, parylene-F, siloxane, organic substituted silazane, quinoxaline and derivatives, co-polymers or mixtures thereof.

22. The low dielectric constant material of claim 20, wherein the organic polymer comprises poly(arlene)ether, poly(naphthalene)ether, polimid, poly(benzocyclobutene), perflourocyclobutane, poly(quinoline), polytetrafluoroethylene, parylene-N, parylene-F, quinoxaline and derivatives, co-polymers or mixtures thereof.

23. The low dielectric material constant material is spun-on to a substrate.

24. A method of forming a gel composition according to claim 1 comprising:
    forming at least one metal oxide particle directly in solution, wherein the at least one
        metal oxide particle comprises a metal oxide material and is chemically reactive with a low dielectric constant material;
    adding de-ionized water to the solution;
    adjusting the pH of the solution to impart colloidal stability to the solution; and
    adjusting the physical properties of the solution to form a gel composition.

25. The method of claim 24, wherein the at least one metal oxide comprises lanthanide oxides, aluminum oxides, cerium oxides, antimony oxides, tin oxides, zirconium oxides, chromium oxides, manganese oxides, zinc oxides, iron oxides, hafnium oxides, titanium oxides or mixtures thereof.

26. The method of claim 24, wherein the at least one metal oxide comprises $Al_2O_3$, $CeO_2$, $Sb_2O_5$, $SnO_2$, $Cr_2O_3$, $MnO_2$, $ZnO$, $Fe_2O_3$, $HfO_2$, $TiO_2$ or mixtures thereof.

27. The method of claim 24, wherein forming at least one metal oxide particle in a solution further comprises forming at least one oxide that is chemically unreactive with the low dielectric contact material.

28. The method of claim 24, wherein forming at least one metal oxide particle in a solution further comprises forming a coating of at least one chemically reactive metal oxide on an at least one chemically unreactive oxide particle.

29. The method of claim 27, or 28 wherein the chemically unreactive oxide is $SiO_2$.

30. The method of claim 24, wherein the low dielectric constant material comprises an organic compound.

31. The method of claim 30, wherein the organic compound comprises an organic compound.

32. The method of claim 24, wherein the low dielectric constant material comprises at least one material that comprises poly(arlene)ether, poly(naphthalene)ether, polimid, poly(benzocyclobutene), perflourcyclobutane, poly(quinoline), hydridosilsesquixane, alkylsilsesquioxane, polytetrafluoroethylene, parylene-N, parylene-F, siloxane, organic substituted silazane, quinoxaline and derivatives, co-polymers or mixtures thereof.

33. The method of claim 31, wherein the organic polymer comprises poly(arlene)ether, poly(naphthalene)ether, polimid, poly(benzocyclobutene), perflourcyclobutane, poly(quinoline), polytetrafluoroethylene, parylene-N, parylene-F, quinoxaline and derivatives, co-polymers or mixtures thereof.

34. The method of claim 24, wherein the at least one metal oxide particle comprises $ZrO_2$.

35. The method of claim 24, wherein the low dielectric constant material is spun-on to a substrate.

36. A compliant polishing substrate for polishing a low dielectric constant material, comprising:

a plurality of aqueous abrasive particles comprising at least one metal oxide that is chemically reactive with the low dielectric material, wherein the plurality of particles are formed directly in a solution and wherein the plurality of particles are retained in the solution before formation of the compliant polishing substrate; and a substrate matrix, wherein the aqueous abrasive particles are incorporated into the substrate matrix.

37. The compliant polishing substrate of claim 36, wherein the at least one metal oxide comprises lanthanide oxides, aluminum oxides, cerium oxides, antimony oxides, tin oxides, zirconium oxides, chromium oxides, manganese oxides, zinc oxides, iron oxides, hafnium oxides, titanium oxides or mixtures thereof.

38. The compliant polishing substrate of claim 36, wherein the at least one metal oxide comprises $Al_2O_3$, $CeO_2$, $Sb_2O_5$, $SnO_2$, $Cr_2O_3$, $MnO_2$, $ZnO$, $Fe_2O_3$, $HfO_2$, $TiO_2$ or mixtures thereof.

39. The compliant polishing substrate of claim 36, further comprising at least one oxide that is chemically unreactive with the low dielectric contact material.

40. The compliant polishing substrate of claim 39, wherein the chemically unreactive oxide is $SiO_2$.

41. The compliant polishing substrate of claim 40, wherein the at least one metal oxide comprises $ZrO_2$.

42. The compliant polishing substrate of claim 41, wherein the $ZrO_2$ abrasive particles are monoclinic $ZrO_2$.

43. The compliant polishing substrate of claim 36, wherein the abrasive particles have a diameter from approximately 3 nanometers to approximately 1,000 nanometers.

44. The compliant polishing substrate of claim 43, wherein the abrasive particles have a diameter from approximately 50 nanometers to approximately 250 nanometers.

45. The compliant polishing substrate of claim 36, wherein the abrasive particles have a multi-modal size distribution.

46. The compliant polishing substrate of claim 45, wherein the abrasive particles have a bi-modal size disttribution, including a plurality of small diameter particles and a second lesser amount of a plurality of large diameter particles.

47. The compliant polishing substrate of claim 46, wherein the mode of the small diameter particles is from about 5 nanometers to about 45 nanometers and the mode of the large diameter particles exceed about 40 nanometers.

48. The compliant polishing substrate of claim 47, wherein the small diameter particle mode is about 20 nanometers.

49. The compliant polishing substrate substrate of claim 47, wherein the large diameter particle mode is from about 40 nanometers to about 250 nanometers.

50. The compliant polishing substrate of claim 49, wherein the large diameter particle mode is from about 50 nanometers to about 150 nanometers.

51. The compliant polishing substrate of claim 47, wherein more than approximately 90% of the particles comprise small diameter particles.

52. A low dielectric constant material prepared using the compliant polishing substrate of claim 57.

53. The low dielectric constant material of claim 52, wherein the material has a dielectric constant of less than about 2.8.

54. The low dielectric constant material of claim 52, wherein the material comprises an organic compound.

55. The low dielectric constant material of claim 54, wherein the organic compound comprises an organic polymer.

56. The low dielectric constant material of claim 52, wherein the low dielectric constant material comprises at least one material that comprises poly(arlene)ether, poly(naphthalene)ether, polimid, poly(benzocyclobutene), perflourocyclobutane, poly(quinoline), hydridosilsesquixane, alkylsipsesquioxane, polytetrafluoroethylene, parylene-N,parylene-F, siloxane, organic substituted silazane, quinoxaline and derivatives, co-polymers or mixtures thereof.

57. The low dielectric constant material of claim 55, wherein the organic polymer comprises poly(arlene)ether, poly(napthalene)ether, polimid, poly(benzocyclobutene), perflourocyclobutane, poly(quinoline), polytetrafluoroethylene, parylene-N, parylene-F, quinoxaline and derivatives, co-polymers or mixtures thereof.

58. The low dielectric material of claim 52, wherein the low dielectric constant material is spun-on to a substrate.

* * * * *